United States Patent
Kirisawa

(10) Patent No.: US 7,710,201 B2
(45) Date of Patent: May 4, 2010

(54) POWER AMPLIFIER CIRCUIT, CONTROL METHOD THEREOF AND CONTROL PROGRAM THEREOF

(75) Inventor: Akihiro Kirisawa, Tokyo (JP)

(73) Assignee: NEC Corporation, Tokyo (JP)

( * ) Notice: Subject to any disclaimer, the term of this patent is extended or adjusted under 35 U.S.C. 154(b) by 29 days.

(21) Appl. No.: 12/042,739

(22) Filed: Mar. 5, 2008

(65) Prior Publication Data

US 2008/0218269 A1    Sep. 11, 2008

(30) Foreign Application Priority Data

Mar. 6, 2007    (JP) ............................. 2007-056069

(51) Int. Cl.
*H03G 3/10* (2006.01)
(52) U.S. Cl. ........................................ 330/284; 330/279
(58) Field of Classification Search ............... 330/278, 330/279, 282, 284
See application file for complete search history.

(56) References Cited

U.S. PATENT DOCUMENTS 6,072,998 A * 6/2000 Kaku ........................ 455/234.2

FOREIGN PATENT DOCUMENTS

| JP | 2003244001 A | 8/2003 |
| JP | 2004072556 A | 3/2004 |
| JP | 2004221737 A | 8/2004 |
| JP | 2005117315 A | 4/2005 |
| JP | 2007005876 A | 1/2007 |

* cited by examiner

*Primary Examiner*—Khanh V Nguyen

(57) ABSTRACT

A power amplifier circuit includes a first variable gain amplifier for amplifying an input signal, a second variable gain amplifier for amplifying an output signal of the first amplifier, and a control circuit for controlling the gain of the first variable gain amplifier based on the output signal of the first variable gain amplifier and the gain of the second variable gain amplifier.

20 Claims, 17 Drawing Sheets

| OUTPUT LEVEL (dBm) | REFERENCE VOLTAGE Vr (V) (DETECTION VOLTAGE) | SUPPLY VOLTAGE OF POWER AMPLIFIER Vd(V) |
|---|---|---|
| 40 | 3.3 | 10 |
| 39 | 3.1 | 10 |
| 38 | 2.9 | 10 |
| 37 | 2.7 | 10 |
| 36 | 2.5 | 10 |
| 35 | 2.4 | 10 |
| 34 | 2.3 | 10 |
| 33 | 2.2 | 10 |
| 32 | 2.1 | 10 |
| 31 | 2.0 | 10 |
| 30 | 2.1 | 5 |
| 29 | 2.0 | 5 |
| 28 | 1.9 | 5 |
| 27 | 1.8 | 5 |

FIG.8

| OUTPUT LEVEL (dBm) | REFERENCE VOLTAGE Vr (V) | SUPPLY VOLTAGE OF POWER AMPLIFIER Vd(V) |
|---|---|---|
| 40 | 3.7 | 10 |
| 39 | 3.5 | 10 |
| 38 | 3.3 | 10 |
| 37 | 3.1 | 10 |
| 36 | 2.9 | 10 |
| 35 | 2.8 | 10 |
| 34 | 2.7 | 10 |
| 33 | 2.6 | 10 |
| 32 | 2.5 | 10 |
| 31 | 2.4 | 10 |
| 30 | 2.3 | 5 |
| 29 | 2.2 | 5 |
| 28 | 2.1 | 5 |
| 27 | 2.0 | 5 |

FIG.9

POWER AMPLIFIER CIRCUIT, CONTROL METHOD THEREOF AND CONTROL PROGRAM THEREOF

INCORPORATION BY REFERENCE

This application is based upon and claims the benefit of priority from Japanese patent application No. 2007-056069, filed on Mar. 6, 2007 the disclosure of which is incorporated herein in its entirety by reference.

BACKGROUND OF THE INVENTION

1. Technical Field

The present invention relates to a power amplifier circuit.

2. Background Art

In a power amplifier circuit used for a transmitter or the like of radio communication equipment, in order to keep an output of the transmitter constant, the change in an output of a power amplifier is monitored, and the change is fed back to an input level thereof.

FIG. 15 a diagram showing a power amplifier circuit which is generally and widely used and is disclosed in Japanese Patent Application Laid-Open No. 2004-072556. The power amplifier circuit includes a variable attenuator (ATT) 21, an amplifier 22, a directional coupler (D-CPL) 23, a detector (DET) 24, a resistor 25, an operational amplifier (OP-AMP) 26, a reference voltage source (REF) 27 and a low pass filter (LPF) 28.

An output of the amplifier 22 is detected by the DET 24 through the D-CPL 23. The OP-AMP 26 outputs a difference between an output of the DET 24 and a reference voltage of the REF 27. The output is fed back negatively to the ATT 21 through the LPF 28 which is a loop filter performing phase compensation. Thereby output power of the amplifier 22 is kept constant. The power amplifier circuit includes the D-CPL 23 on an output side of the amplifier 22. Accordingly, when the output power amplified by the amplifier 22 passes through the D-CPL 23, a part of the output power is branched and enter the DET 24. As a result, an electric power is wasted.

FIG. 16 shows a diagram showing other power amplifier circuit of a related art of the present invention, which is disclosed in Japanese Patent Application Laid-Open No. 2007-005876. In the power amplifier circuit shown in FIG. 16, a level control function and an electric power amplifying function provided in the amplifier 22 shown in FIG. 15 are separated. That is, the amplifier 22 performs a level control and a power amplifier 29 amplifying a power is arranged on an output side of the D-CPL 23. In the circuit configuration, a loss can be reduced, since the D-CPL 23 is set on an input side of the power amplifier 29. Thereby, the power amplifier shown in FIG. 16 can highly improve efficiency in power consumption.

FIG. 17 shows a diagram showing another power amplifier circuit of a related art of the present invention. In the power amplifier circuit shown in FIG. 17, a power supply (PS) 30 for controlling a transmission output is connected to the power amplifier 29 shown in FIG. 16. The power amplifier circuit shown in FIG. 17 controls a voltage which the PS 30 supplies to the power amplifier 29 according to a transmission output.

Japanese Patent Application Laid-Open No. 2003-244001, Japanese Patent Application Laid-Open No. 2004-221737 and Japanese Patent Application Laid-Open No. 2005-117315 disclose a related art of the power amplifier circuit which includes a pre-amplifier and a post-power amplifier, and changes a voltage supplied to the post-power amplifier to improve efficiency.

SUMMARY

An exemplary object of the present invention is to provide a power amplifier circuit which operates an amplifier at high efficiency, a control method for the power amplifier circuit and a control program of the power amplifier circuit.

A circuit according to an exemplary aspect of the invention includes a first variable-gain amplifier for amplifying an input signal at a first gain, a second variable-gain amplifier for amplifying an output signal of the first variable-gain amplifier at a second gain, and a control circuit for controlling the first gain based on the output signal of the first variable-gain amplifier and the second gain.

A method according to an exemplary aspect of the invention includes a first variable-gain amplifier having a first gain and a second variable-gain amplifier having a second gain for amplifying an output signal of the first variable-gain amplifier, the method including detecting an amplitude of the output signal of the first variable-gain amplifier, and controlling the first gain based on the amplitude of the output signal of the first variable-gain amplifier and the second gain.

A power amplifier circuit control program for causing a CPU of the control unit, to realize a function of the power amplifier circuit.

BRIEF DESCRIPTION OF THE DRAWINGS

Exemplary features and advantages of the present invention will become apparent from the following detailed description when taken with the accompanying drawings in which:

FIG. 8 is a diagram showing an example of control table corresponding to FIG. 7 for showing a relation of the output power of the power amplifier 4;

FIG. 9 is an example of a control table adopted in the first exemplary embodiment which shows a relation between an output power and a reference voltage Vr 75;

EXEMPLARY EMBODIMENT

Exemplary embodiments of the present invention will now be described in detail in accordance with the accompanying drawings.

Figure 1:
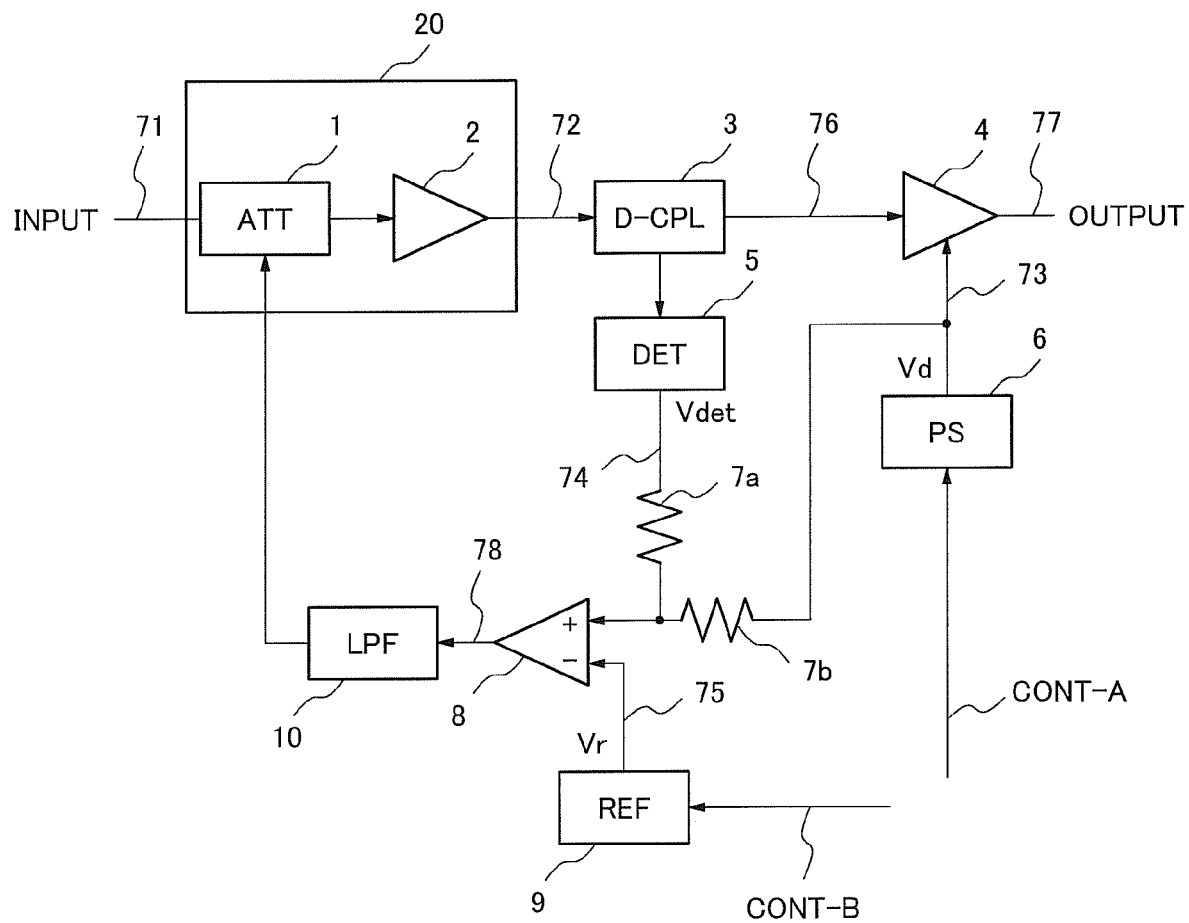
FIG. 1 is a diagram showing a configuration of a power amplifier circuit of a first exemplary embodiment.

1. First Exemplary Embodiment 1.1 Configuration of First Exemplary Embodiment 1.1.1 Whole Configuration FIG. 1 shows a configuration of a power amplifier circuit of the first exemplary embodiment. The power amplifier circuit includes two amplifiers of a pre-amplifier 20 and a post (final) power amplifier 4. The pre-amplifier 20 includes an amplifier 2 and an attenuator (ATT) 1. A directional coupler (D-CPL) 3 is arranged on a prior stage of the power amplifier 4. The power amplifier circuit includes the ATT 1, the amplifier 2, the D-CPL 3, the power amplifier 4, a detector (DET) 5, a power supply (PS) 6, an analog adder including resistors 7a and 7b, an operational amplifier (OP-AMP) 8, a reference voltage source (REF) 9 and a low pass filter (LPF) 10. A connection configuration of each circuit is described below.

After passing the ATT 1, an input signal 71 (modulating signal, for example) from a prior stage apparatus is amplified by the amplifier 2. An output signal 72 of the amplifier 2 passes through the D-CPL 3 and enters the power amplifier 4 as a signal 76. The signal 76 is amplified to a desired output value by the power amplifier 4 and is output as an output signal 77. The PS 6 is connected to the power amplifier 4. The PS 6 applies a supply voltage (Vd) 73 to the power amplifier 4. An output voltage of the PS 6 is equal to the Vd 73 to the power amplifier 4. The PS 6 is a power supply such as a switching power supply. The output voltage of the PS 6 can be controlled by a control signal (CONT-A) from an outside. On the other hand, the D-CPL 3 is also connected to the DET 5. The DET 5 detects an output signal of the amplifier 2 branched at the D-CPL 3 and outputs a detection voltage (Vdet) 74. the DET 5 applies the Vdet 74 to a non-inverting input of the OP-AMP 8 via the resistor 7a. The output voltage of the PS 6 is also applied to the non-inverting input of the OP-AMP 8 via the resistor 7b. The reference voltage (Vr) 75 which the REF 9 outputs is supplied to an inverting input of the OP-AMP 8. The Vr 75 of the REF 9 can be controlled by a control signal (CONT-B) from an outside. An output of the OP-AMP 8 enters the ATT 1 through the LPF 10. An output of the LPF 10 controls the ATT 1. Under the conditions, the Vdet 74 is applied, via the OP-AMP 8, with a polarity which generates a negative feedback control over the ATT 1 and the amplifier 2. In the power amplifier circuit of the exemplary embodiment of the present invention, the D-CPL 3, the DET 5, the resistors 7a and 7b, the OP-AMP 8, the REF 9 and the LPF 10 act as a power controller.

1.1.2 Circuitry of Power Amplifier

Figure 2:
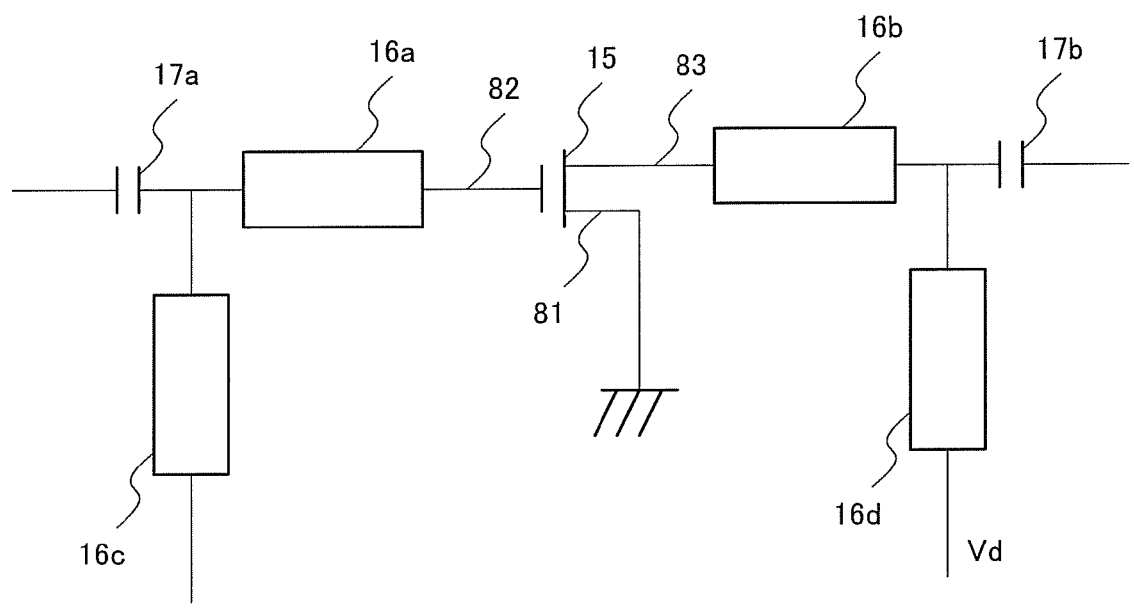
FIG. 2 is a diagram showing an example of circuitry of a power amplifier.

FIG. 2 shows an example of a circuitry of the power amplifier 4. The power amplifier 4 is composed of a single-stage amplifier of a field effect transistor (FET) 15. In FIG. 2, a source terminal 81 of the FET 15 is grounded. A gate terminal 82 of the FET 15 is connected to an input via a series circuit of a matching circuit 16a and a coupling capacitor 17a. A bias voltage of a gate side of the FET 15 is supplied to a node of the coupling capacitor 17a and the matching circuit 16a via a matching circuit 16c. A drain terminal 83 of the FET 15 is connected to an output via a series circuit of a matching circuit 16b and a coupling capacitor 17b. The Vd 73 to a drain of the FET 15 is supplied to a node of the matching circuit 16b and the coupling capacitor 17b via a matching circuit 16d.

1.2 Operating Principle

An operating principle of the power amplifier of the first exemplary embodiment will be described. An operating characteristic of each part of the first exemplary embodiment will be described in turn.

1.2.1 Relation between Electric power Passing Coupler and Output Voltage of Detector A relation between a signal power passing the D-CPL 3 (hereinafter, referred to as "D-CPL 3 passing power") and the detection voltage (Vdet) 74 that the DET 5 outputs will be described.

Figure 4:
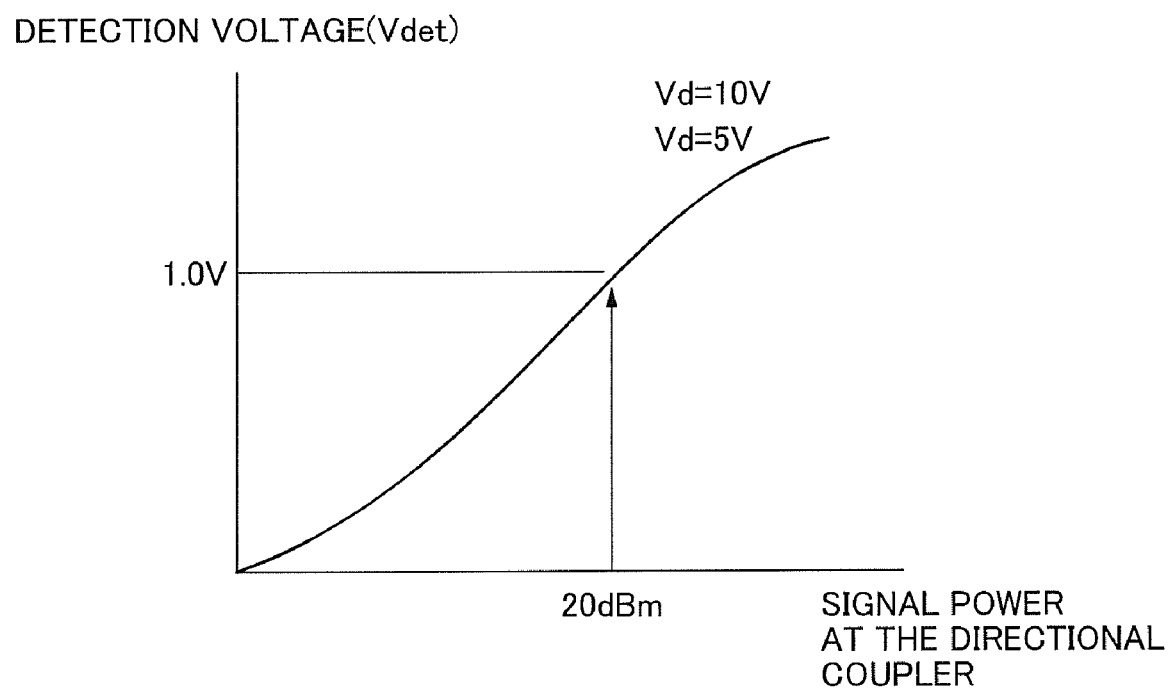
FIG. 4 is a relation between the D-CPL 3 passing power and the Vdet 74.

FIG. 4 shows a relation between the D-CPL 3 passing power and the Vdet 74. The Vdet 74 output by the DET 5 becomes high while the D-CPL 3 passing power increases. FIG. 4 shows a case of 5 V of the Vd 73 for the power amplifier 4 and a case of 10 V thereof. Even if the Vd 73 of the cases are different from each other, curves of the cases which shows a relation between the D-CPL 3 passing power and the Vdet 74 are identical each other. Since the DET 5 is arranged on a pre-stage of the power amplifier 4, the Vdet 74 of the DET 5 does not depend on the Vd 73 for the power amplifier 4. However, a relation between the Vdet 74 and the output power of the power amplifier 4 depends on the Vd 73 for the power amplifier 4. This is described below.

1.2.2 Relation between Supply Voltage and Gain for Power Amplifier

A change in a gain of the power amplifier 4 against a change in the Vd 73 and a relation between an output of the power amplifier 4 and the Vdet 74 of the DET 5 will be described.

Figure 5:
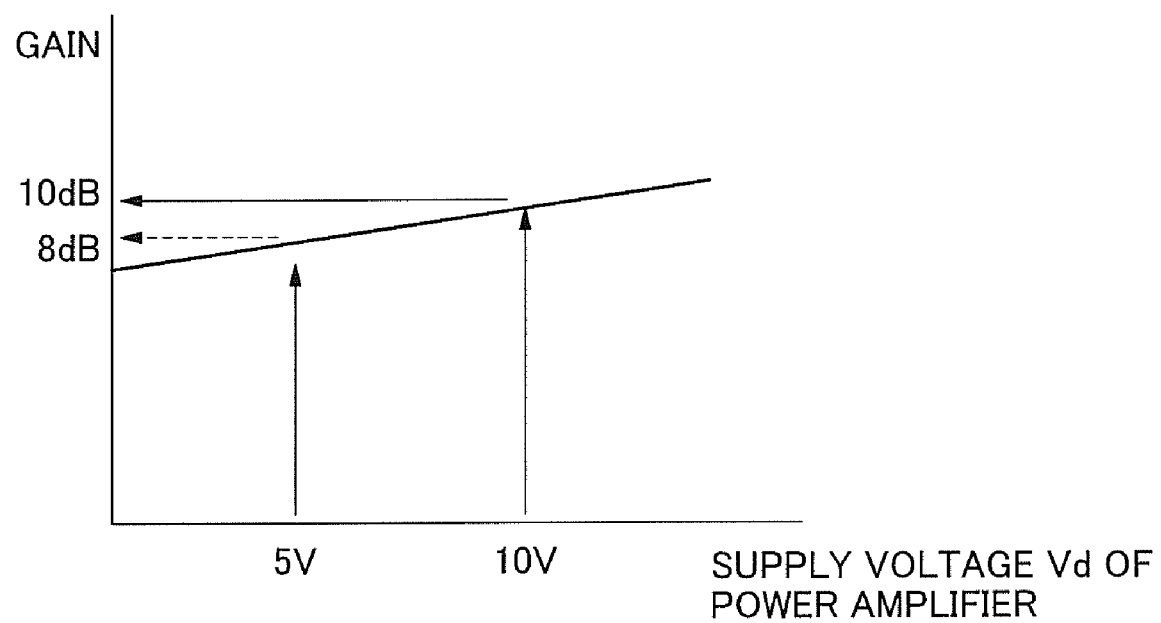
FIG. 5 is a diagram showing a relation between the Vd 73 (drain voltage) to the power amplifier 4 and the gain thereof.

FIG. 5 shows a relation between the Vd 73 (drain voltage) to the power amplifier 4 and the gain thereof. Even if the Vd 73 to the power amplifier changes, the gain thereof does not change in theory. However, as shown in FIG. 5, the gain practically changes according to the Vd 73. For example, in the power amplifier 4, while the drain voltage of the FET 15 drops, the gain drops. In FIG. 5, when the Vd 73 is 10 V, the gain is 10 dB. However, when the Vd 73 is 5 V, the gain becomes 9 dB to change by 1 dB.

In the power amplifier 4, the gain thereof changes according to the Vd 73. Therefore, a relation between the output power of the power amplifier 4 and the Vdet 74 of the DET 5 also changes according to the supply voltage Vd 73.

Figure 6:
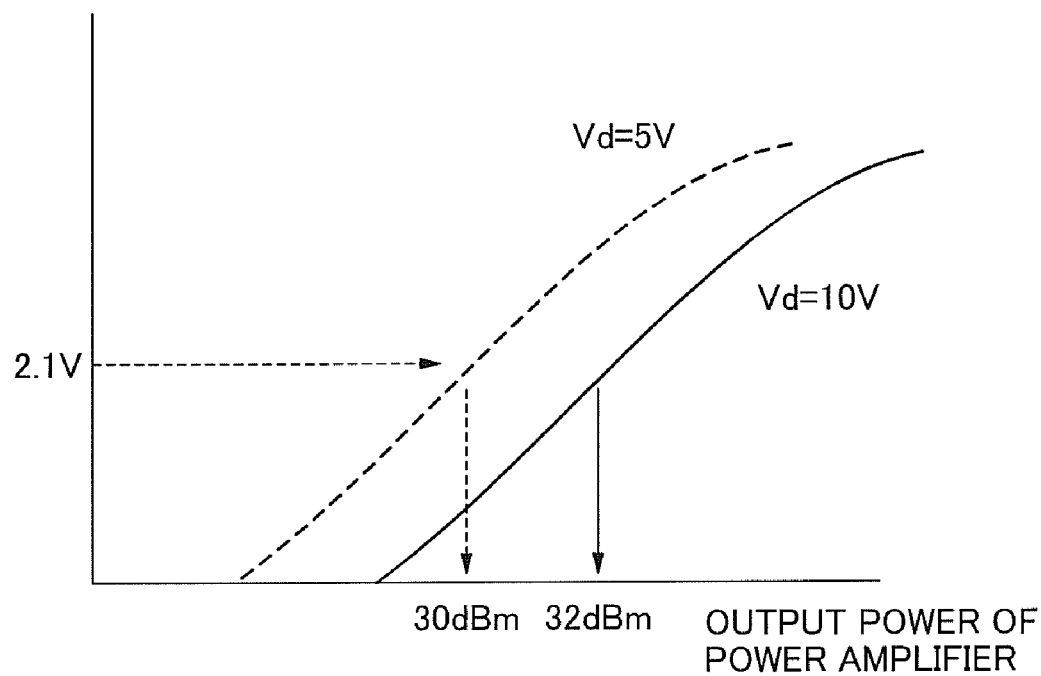
FIG. 6 is a diagram showing a relation between an output power of the power amplifier 4 and the Vdet 74 of the DET 5.

1.2.3 Relation between Output Power of Power Amplifier and Detection Voltage of Detector FIG. 6 shows a relation between an output power of the power amplifier 4 and the Vdet 74 of the DET 5. When the supply voltage Vd 73 to the power amplifier 4 is 5 V and the Vdet 74 is 2.1 V, the output power of the power amplifier 4 corresponds to 30 dBm. However, when the supply voltage Vd 73 to the power amplifier 4 is 10 V, a gain of the power amplifier becomes different from a gain in the supply voltage of 5 V. Therefore, even if the Vdet 74 is 2.1 V just as a case in the Vd 73 of 5 V, when the Vd 73 is 10 V, the output power of the power amplifier 4 indicates 32 dBm. That is, when the Vd 73 to the power amplifier 4 is 10 V, even if the output power of the power amplifier 4 is 30 dBm, the Vdet 74 becomes lower than 2.1 V. This means that a relation between the output power of the power amplifier 4 and the Vdet 74 of the DET 5 includes characteristics depending on the Vd 73 of the power amplifier 4.

1.2.4 Disadvantage in Feedback Control without Considering Supply Voltage to Power Amplifier Here, a disadvantage which occurs when a feedback control is performed without considering the supply voltage Vd 73 to the power amplifier 4 will be described.

Suppose that connection for inputting a Vd 73 to the OP-AMP 8 via the resistance 7*b* does not exist, in FIG. 1. That is, without considering the Vd 73 to the power amplifier 4, only the Vdet 74 is applied to the non-inverting input of the OP-AMP 8. As mentioned below, in order to efficiently use the power amplifier, according to an output power thereof, the Vd 73 needs to be changed. Accordingly, the Vd 73 is set to 5 V when the power amplifier is used in 30 dBm or less of the output power, and the Vd 73 is changed to 10 V when the power amplifier is used in not less than 31 dBm of the output power. Then, the amplifier 2 is controlled such that the output power thereof may be kept constant in each case of a case in which the Vd 73 of the amplifier 4 is 5 V and the output power thereof is 30 dBm or less, and a case in which the Vd 73 of the amplifier 4 is 10 V and the output power thereof is not less than 31 dBm. Therefore, a relation between the output power of the power amplifier 4 and the Vdet 74 of the DET 5 becomes a combination of two characteristics shown in the FIG. 6, that is, a relation shown in FIG. 7.

Figure 7:
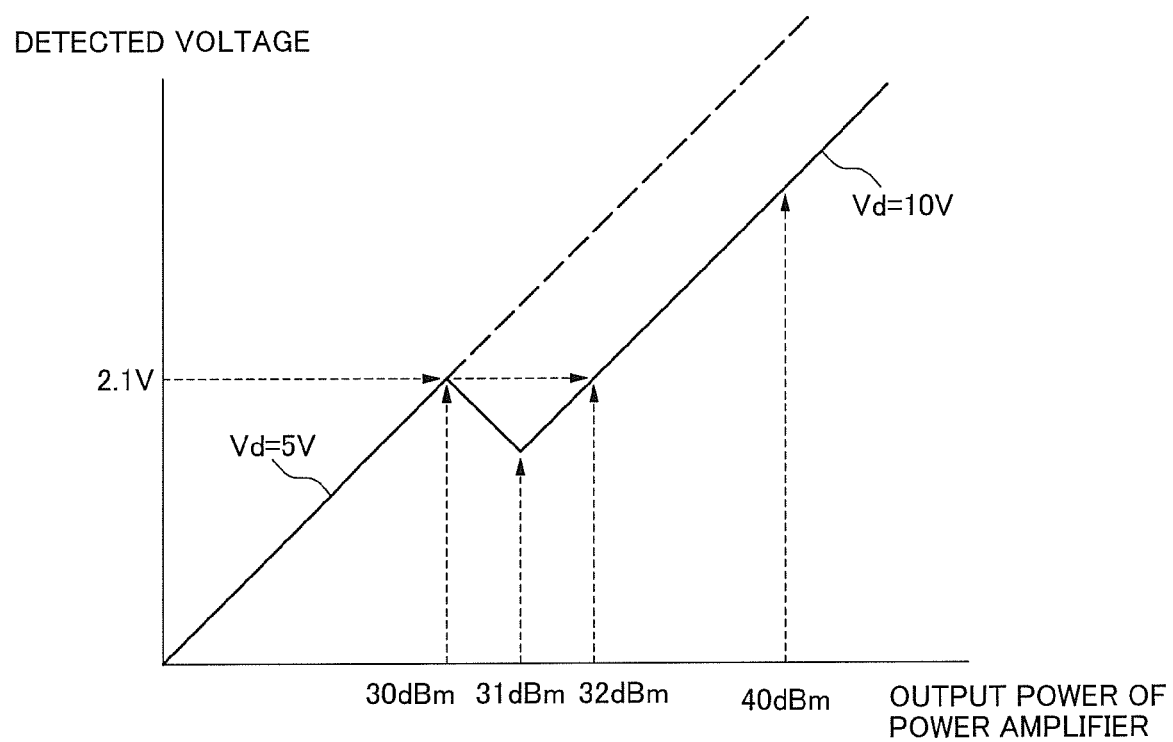
FIG. 7 is a diagram showing a relation between the output power of the power amplifier 4 and the Vdet 74 of the DET 5 from another point of view.

FIG. 7 shows a relation between the output power of the power amplifier 4 and the Vdet 74 of the DET 5 from another point of view. A relation between the Vdet 74 and the output power, in case that a feedback control is performed without considering the Vd 73 to the power amplifier 4, is shown by a solid line in the FIG. 7.

FIG. 8 is an example of control table corresponding to FIG. 7 showing a relation of the output power of the power amplifier 4, the reference voltage Vr 75 (this is equal to the Vdet 74) and the Vd 73 for the power amplifier 4. Referring to FIGS. 7 and 8, the Vd 73 is 5 V in an output power range of the power amplifier 4 of 30 dBm or less. On the other hand, when Vd 73 is changed to 10 V in the output power range of not less than 31 dBm, the Vr 75 (detection voltage Vdet 74) of 2.0 V corresponds to the output power of 31 dBm, and the Vr 75 of 2.1 V corresponds to that of 32 dBm. Thus, the output powers of 30 dBm (in case of Vd=5 V) and 32 dBm (in case of Vd=10 V) correspond to the reference voltage Vr 75 of 2.1 V. When there is two output powers corresponding to the same reference voltage Vr 75, a feedback control loop becomes unstable, and control thereof may be divergent. Thus, when a feedback control is performed without considering the supply voltage Vd 73 to the power amplifier 4, disadvantage in which a feedback loop becomes unstable occurs.

1.2.5 Power Level Control Method in First Exemplary Embodiment

In the exemplary embodiment, an attenuation factor of the ATT 1 is controlled according to the supply voltage Vd 73 to the power amplifier 4 and the detection voltage Vdet 74 to control the output power of the power amplifier 4. In order to stably perform a feedback control of the output power of the power amplifier 4, the output power of the power amplifier 4 needs to increase smoothly in accordance with increase in the detection voltage Vdet 74. For example, a relation between the Vdet 74 and the output power of the power amplifier 4 is controlled so that the characteristic in the Vd 73 of 10 V may continue with that in the Vd 73 of 5 V, as a broken line shown in FIG. 7. In other words, the control of the attenuation factor of the ATT 1 may be performed based on the detection voltage Vdet 74 and the supply voltage Vd 73 supplied to the power amplifier 4.

In the first exemplary embodiment, as shown in FIG. 1, the Vdet 74 outputted from the DET 5 and Vd 73 outputted from the PS 6 are added by an analog adder including resistors 7*a* and 7*b*. The added voltage is compared by the OP-AMP 8 with the Vr 75 from the REF 9. The Vr 75 is set according to a desired output power set in advance. An situation in which two output voltage values to be controlled to one reference voltage exist as shown in FIG. 7 and FIG. 8 is avoidable by the control above described.

FIG. 9 is an example of a control table adopted in the first exemplary embodiment which shows a relation between an output power and a reference voltage Vr 75. The Vr 75 is set to a desired output power based on the control table shown in FIG. 9. For example, when the output power is set to 40 dBm, the Vr is set to 3.7 V.

According to the setting, the power amplifier circuit controls the ATT 1 so that the reference voltage Vr 75 of 3.7 V and the input voltage to the OP-AMP become equal. Thereby, the output power of the power amplifier 4 is kept constant.

A right column in the control table shown in FIG. 9 shows a supply voltage Vd 73 to the power amplifier 4. When a desirably set output power of the power amplifier 4 is low, a supply voltage Vd 73 applied to the power amplifier 4 is also low. Thereby, efficiency of the power amplifier 4 improves. When the output power of the power amplifier 4 is set to be high, a high supply voltage is applied to the power amplifier 4. Thereby, the power amplifier 4 can output a high output power. In FIG. 9, when the output power is set to be not less than 31 dBm, a supply voltage applied to the power amplifier 4 becomes 10 V. When the output power is set to be 30 dBm or less, a supply voltage applied to the power amplifier 4 becomes 5 V.

An example of controlling an attenuation factor of the ATT 1 is performed based on not only the Vdet 74 but also the Vd 73 supplied to the power amplifier 4 will be explained.

In FIG. 1, the resistances 7*a* and 7*b* act as an analog adder to add voltages at a predetermined ratio. That is, a voltage of the sum of the Vdet 74 and the added voltage based on the Vd 73 is applied to the non-inverting input of the OP-AMP 8. In the first exemplary embodiment, when the Vd 73 to the power amplifier 4 is 10 V, the resistances 7*a* and 7*b* are arranged so that a voltage applied to the non-inverting input of the Op-AMP 8 become high by 0.2 V compared with a case in which the Vd 73 is 5 V. In the control table shown in FIG. 9, a voltage applied to the non-inverting input of the OP-AMP 8 is increased with respect to the value of Vr 75 in the control table shown in FIG. 8 in both cases of 10V of the Vd 73 and 5 V thereof. Specifically, the increased value is 0.2 V in the case of 5 V of the Vd 73. The increased value is 0.4 V in the case of 10 V of the Vd 73. As a result, when the Vd 73 is 10V, the Vdet 74 is increased by 0.2 V which is the difference voltage compared with the case of 5V of the Vd 73. In FIG. 9, italic figures indicate added voltage values. Negative feedback control is performed so that the sum of the Vdet 74 and the increased voltage becomes equal to the Vr 75. Therefore, a desired output power is obtained by setting the Vr 75 corresponding to the output power of the power amplifier shown in FIG. 9.

1.3 Operation of First Exemplary Embodiment

1.3.1 Relation between Arrangement of Directional Coupler and Power Efficiency in Power Amplifier Circuit Hereinafter, an operation of the power amplifier circuit of the first exemplary embodiment will be described in detail.

In FIG. 1, after passing the ATT 1, an input 71 from the prior stage apparatus is amplified in the amplifier 2. An output signal 72 from the amplifier 2 passes through the D-CPL 3. After being amplified to a desired electric power by the power amplifier 4, a signal 76 from the D-CPL 3 becomes an output signal 77. The D-CPL 3 branches a part of a signal which passes therethrough to output to the DET 5. The DET 5 outputs the detection voltage 74 according to a signal level of an output from the amplifier 2.

Thus, according to the first exemplary embodiment, the power amplifier circuit includes two amplifiers of the amplifier 2 in a pre-stage and the power amplifier 4 in post stage (final stage). Since the D-CPL 3 is set in front of the power amplifier 4, power efficiency of whole power amplifier circuit improves. The reason is as described below. Since an electric power that passes the D-CPL 3 is high when the D-CPL 3 is arranged after the power amplifier 4, the electric power lost in the D-CPL 3 is also high. In contrast, when the D-CPL 3 is arranged in front of the power amplifier 4, the electric power lost due to passing the D-CPL 3 becomes low. Thus when the D-CPL 3 is arranged in front of the power amplifier 4, the power efficiency of whole power amplifier circuit is improved.

1.3.2 Operation of Feedback Control Circuit

Next, a feedback control circuit will be described. The feedback control circuit performs a feedback control of an output power of the amplifier 2 using an added voltage based on the Vdet 74 of the DET 5 and the Vd 73. In FIG. 1, the resistance 7b which is provided as an analog adder is connected to the OP-AMP 8 as well as the resistance 7a. The Vd 73 is applied to the non inverting input of the OP-AMP 8 together with the Vdet 74 at a predetermined ratio. The added voltage is compared with the Vr 75 which the REF 9 outputs in the OP-AMP 8. A difference voltage 78 amplified in the OP-AMP 8 is fed back to the ATT 1 via the LPF 10. A negative feedback control is performed so that an output power of the amplifier 2 becomes constant. In other words, when an output power of the amplifier 2 becomes high, the Vdet 74 becomes high. When the Vdet 74 becomes high, an output of the OP-AMP 8 also becomes high. At this time, when the output voltage of the OP-AMP 8 increases, the ATT 1 is controlled so that attenuation thereby increases. Then, when the Vdet 74 becomes high, the output power of the amplifier 2 becomes low. The negative feedback control operates in such way. When the output power of the amplifier 2 decreases, the Vdet 74 becomes low. At this time, when the attenuation by the ATT 1 is controlled to be low, the output power of the amplifier 2 becomes high. Here, as described in section 1.2.5, the Vd 73 is 5 V or 10 V depending on the desired output power. A voltage applied to the non-inverting input of the OP-AMP 8 also changes according to the value of Vd 73. When the Vd 73 is 10 V, the voltage applied on the non-inverting input of the OP-AMP 8 is higher by 0.2 V than that in a case that the Vd 73 is 5 V. The feedback control circuit operates so that the Vr 75 inputted to the OP-AMP 8 becomes equal to a voltage applied to the non-inverting input of the OP-AMP 8 via the resistances 7a and 7b. The negative feedback control keeps the output of the amplifier 2 constant.

1.3.3 Operation and Power Efficiency of Power Amplifier

An operation and power efficiency of the power amplifier 4 of the first exemplary embodiment will be described.

A power amplifier shown in FIG. 2 is an amplifier including a single-stage FET 15. Matching circuits are connected to the FET 15. A bias circuit is arranged on a gate side thereof. A power is supplied from a drain side thereof. Thus, a circuit configuration in the power amplifier 4 is simple. Number of stages of the amplifier using the FET 15 is a single stage. Since the number of stages of the amplifier is few, fluctuation in an operating condition of the power amplifier 4 during a stable state is small. Therefore, even if control is performed so that a desirable output power of the amplifier 4 is obtained by changing the output of amplifier 2 in a pre-stage thereof to change an input power to the power amplifier 4, a whole power amplifier circuit is normally controlled.

Figure 3:
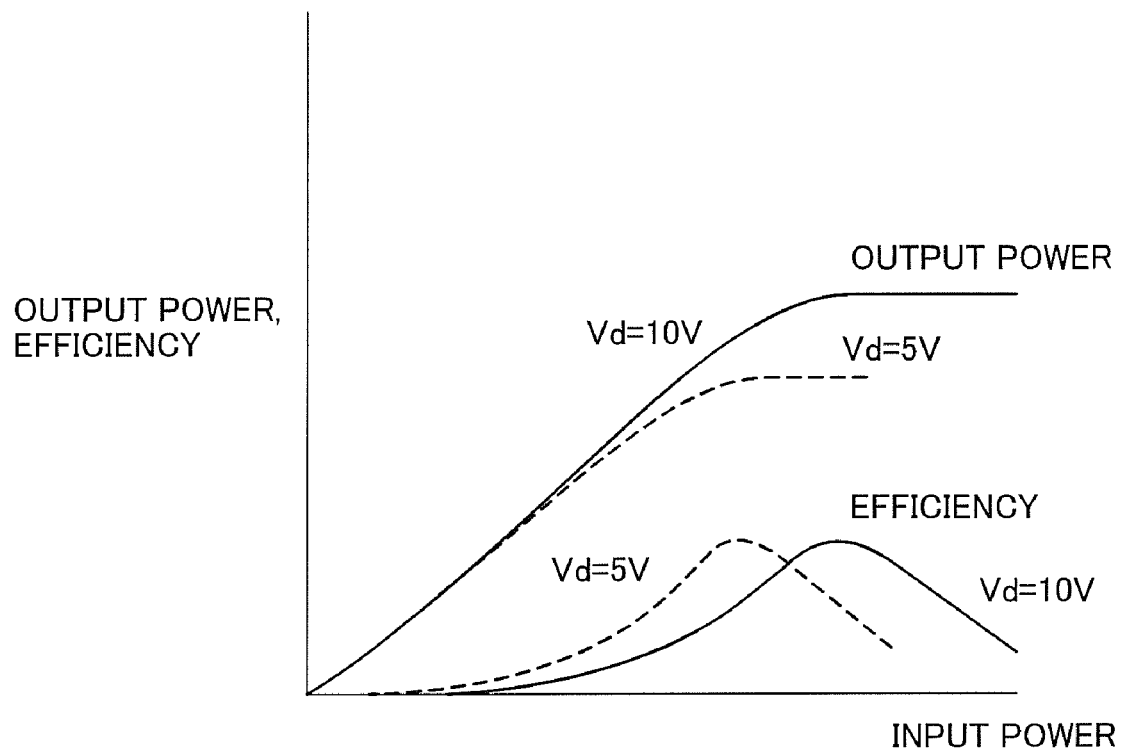
FIG. 3 is a diagram showing an input-output characteristic and an efficiency characteristic on the input-output of the power amplifier 4.

FIG. 3 shows an input-output characteristic and an efficiency characteristic on the input-output in the power amplifier 4. The power amplifier 4 can output a high output power when a Vd 73 thereto is high. Such operation of the power amplifier 4 is obviously recognized based on a characteristic on the output power based on a difference in the supply voltages Vd 73 to the power amplifier 4. On the other hand, according to FIG. 3, the power amplifier 4 is the most efficient in a region near a maximum output thereof under a fixed supply voltage, and the efficiency drops in the other region. Thus, high efficiency can be obtained in a wide output range when the Vd 73 of the power amplifier 4 is kept low in a low output power region and is kept high in a high output power region. As shown in FIG. 3, an output of the power amplifier 4 is saturated to become a constant value when an input power thereto is more than or equal to a certain value. When the output of the power amplifier 4 is saturated, linearity of the input-output characteristic thereof gets worse, and distortion occurs in an output signal thereof. Therefore, it is desirable that a low supply voltage is changed to a high supply voltage in a region where the output power is not saturated with a low supply voltage.

In the first exemplary embodiment, the D-CPL 3 and the DET 5 for detecting the output power of the amplifier 2 are arranged just in front of the power amplifier 4. Thereby, an absolute amount of loss caused by the D-CPL 3 is reduced. The Vd 73 to the power amplifier 4 in a final stage is variable. Therefore, irrespective of the output power of the power amplifier, the efficiency of the power amplifier circuit is always high.

1.4 Effect of First Exemplary Embodiment

As described above, when the Vd 73 is 10 V, a voltage which is 0.2 V higher than a case of the Vd 73 of 5 V is inputted to the non-inverting input of the OP-AMP 8 and is compared with the Vr 75. Thereby, as shown in a FIG. 9, a condition in which two output voltage values to be controlled with respect to one reference voltage exist is avoidable. A relation between the sum of the detection voltage and the added voltage, and the output power is represented as a straight thick broken line shown in FIG. 7. That is, the linearity of the output power of the power amplifier is improved.

According to the first embodiment, the relation between the reference voltage Vr 75 and the output power becomes linear when the voltage determined by the Vd 73 is added to the Vdet 74. However, it is not necessarily that the relation between the reference voltage and the output power after correction is correctly linear. For example, even if the reference voltage increases monotonously with respect to the output power, control of a transmission level does not become unstable.

Accordingly, in the present invention, adding a voltage to the detection voltage at the non inverting input of the OP-AMP 8 in the power amplifier circuit as shown in FIG. 1 can be made without correct adjustment.

2. Second Exemplary Embodiment

In the first exemplary embodiment mentioned above, negative feedback control of the power amplifier circuit is performed by an analog processing. However, the present invention can be realized by digital processing in negative feedback control.

2.1 Configuration and Operation of Second Exemplary Embodiment

Figure 10:
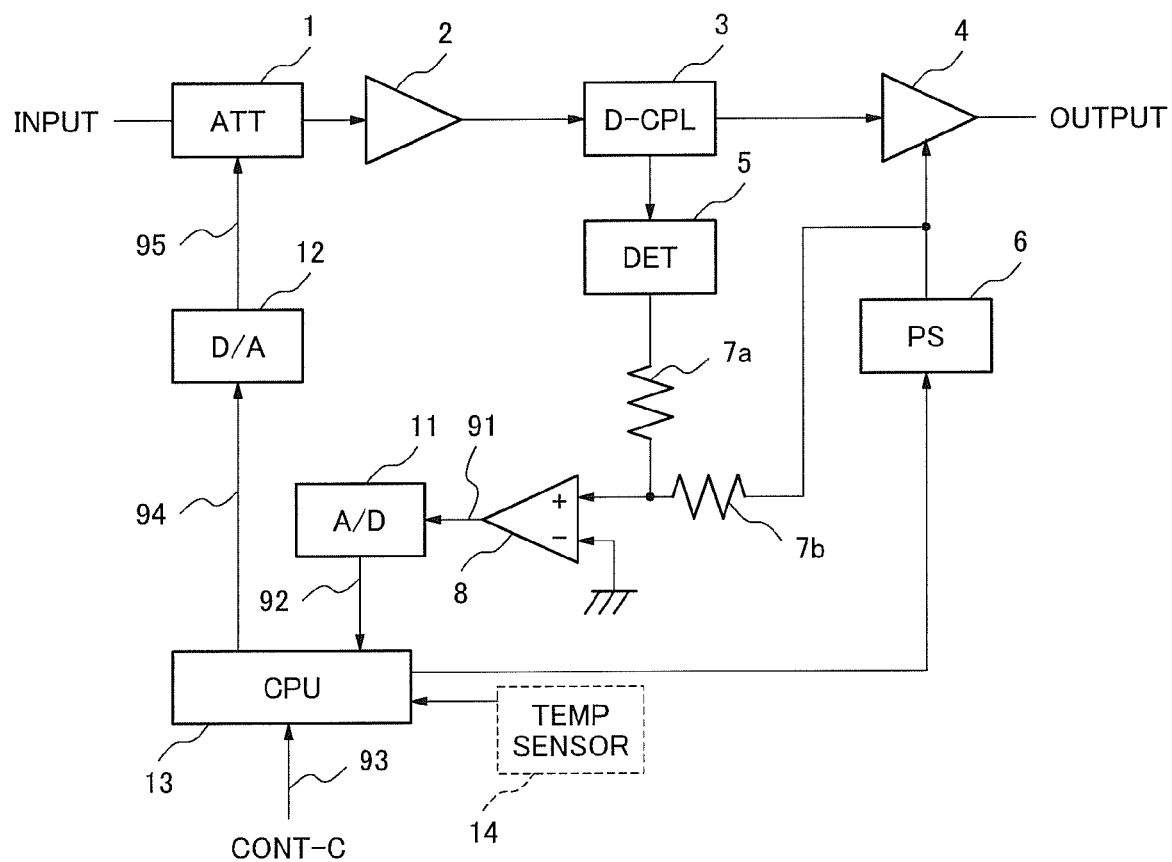
FIG. 10 is a diagram showing a second exemplary embodiment of the present invention.

FIG. 10 shows the second exemplary embodiment of the present invention. According to the first exemplary embodiment shown in FIG. 1, the output of the operational amplifier (OP-AMP) 8 is outputted to the low pass filter (LPF) 10. The LPF 10 operates as an analog loop filter. According to the second exemplary embodiment, an output signal 91 of the OP-AMP 8 is outputted to an A/D converter (A/D) 11. A control signal (CONT-C) 93 for setting an output power of the power amplifier 4 enters a CPU 13. The CPU 13 processes an output signal 92 and the control signal 93 of the A/D 11 to generate a feedback signal 94 and implement a filtering function. The feedback signal 94 is converted into an analog signal via a D/A converter (D/A) 12. And a feedback signal 94 converted into an analog signal 95 controls the ATT 1.

Figure 13:
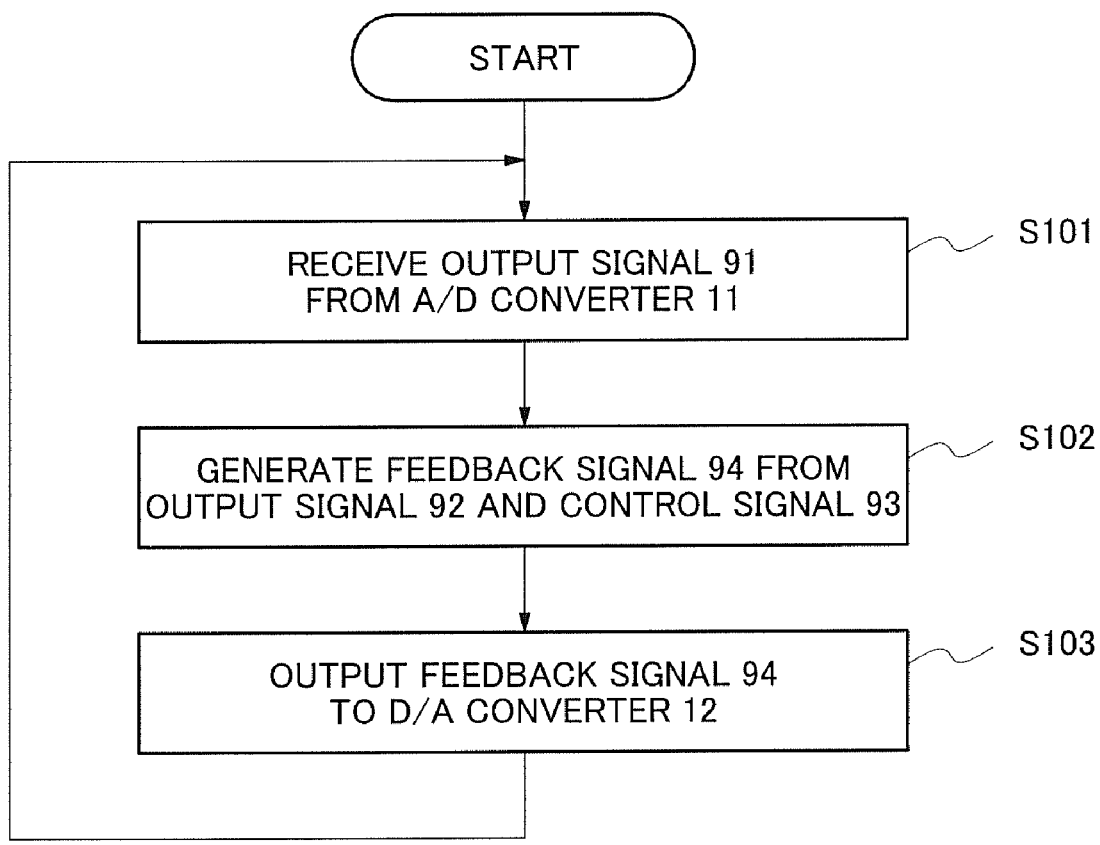
FIG. 13 is a diagram showing a process flow of CPU 13 in the second exemplary embodiment.

FIG. 13 shows a process flow of CPU 13 in the second exemplary embodiment. The CPU 13 receives the output signal 91 of the OP-AMP 8 as a digital signal from the A/D 11 (S101). The CPU 13 generates the feedback signal 94 from the output signal 92 of the A/D 11 and the control signal 93 (S102). And the CPU 13 outputs the feedback signal 94 to a D/A 12 (S103).

2.2 Effect of Second Exemplary Embodiment

In the second exemplary embodiment, when the CPU 13 implements a digital filtering function, for example, a user of the power amplification circuit can freely set a time constant of the loop. The CPU 13 compares a numerical value based on the control signal 93 with a numerical value converted by the A/D 11 to generate the feedback signal 94. Thus, the external REF 9 shown in FIG. 1 can be omitted. According to the second exemplary embodiment, since the digital filter controlled by the CPU 13 is utilized, a feedback loop can be controlled precisely. In the second exemplary embodiment, it is possible to add a temperature sensor (TEMP SENSOR) 14 and to input an output thereof to the CPU 13. When the feedback signal 94 is generated in the CPU 13, a fluctuation of the characteristic of the detector (DET) 5 and resistances 7a and 7b based on a fluctuation of an ambient temperature can be corrected using an output value of the TEMP SENSOR 14.

3. Third Exemplary Embodiment

3.1 Configuration and Operation of Third Exemplary Embodiment

Figure 11:
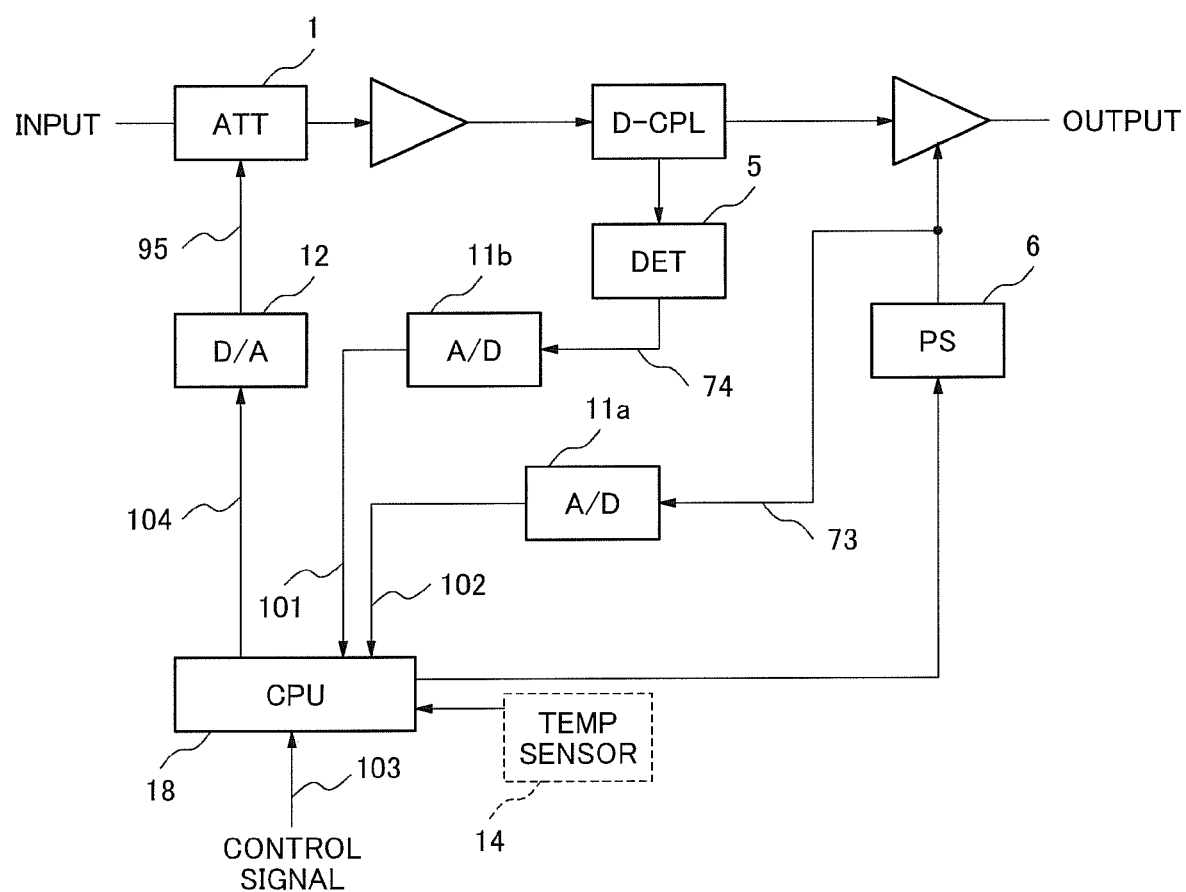
FIG. 11 is a diagram showing a third exemplary embodiment of the present invention.

FIG. 11 shows a third exemplary embodiment of the present invention. In the third exemplary embodiment, a part of the exemplary embodiment shown in FIG. 10 is changed. In the embodiment, A/D converters (A/D) 11a and 11b corresponding to an output of the detector (DET) 5 and the power supply 6 are used instead of the operational amplifier (OP-AMP) 8 and the resistances 7a and 7b in FIG. 10. Outputs of the A/D 11a and 11b enter a CPU 18.

Figure 14:
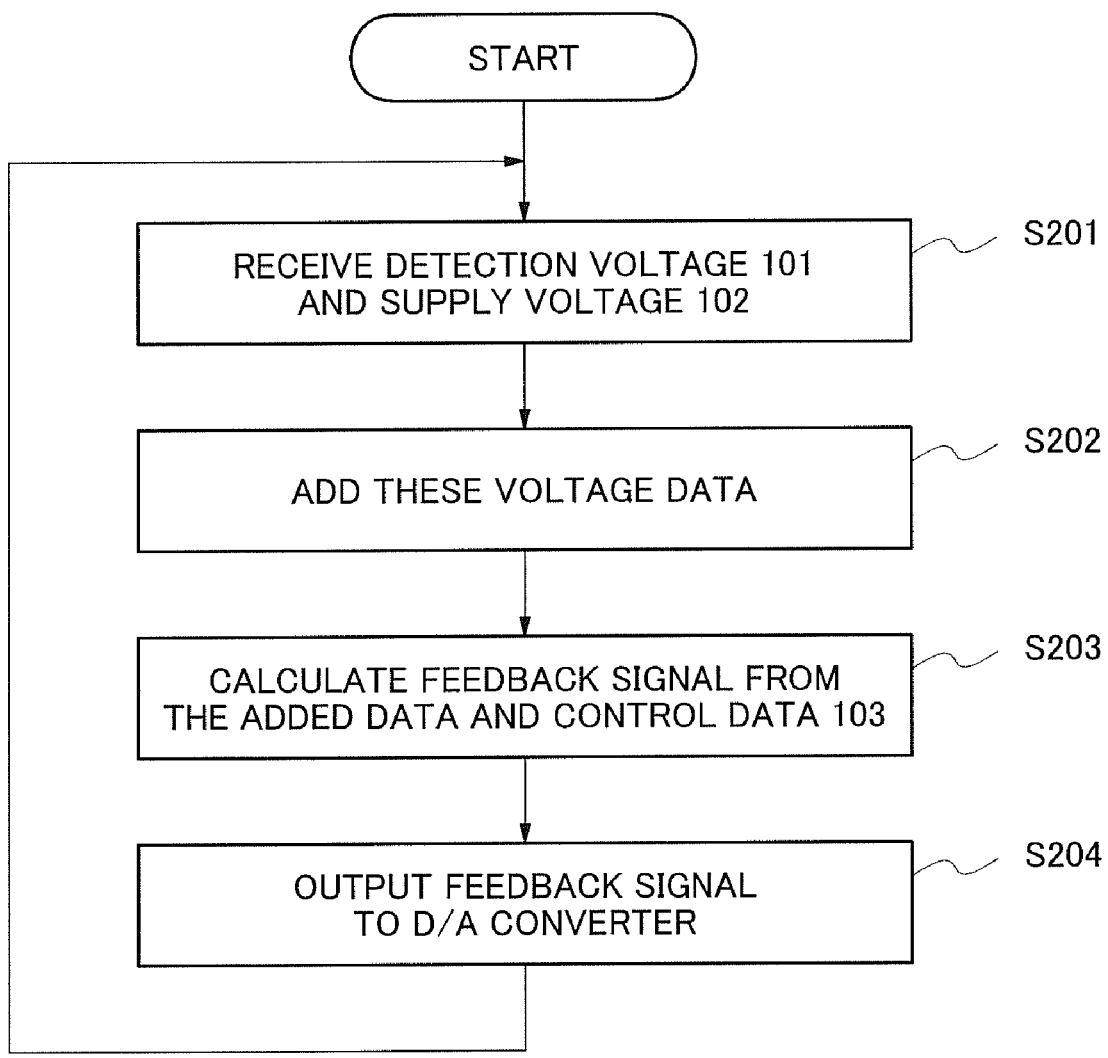
FIG. 14 is a diagram showing a processing flow of CPU 18 in the third exemplary embodiment.

FIG. 14 shows a process flow of CPU 18 in the third exemplary embodiment. The A/D 11a and 11b convert a detection voltage 74 and a supply voltage 73 into digital signals 101 and 102 respectively. The CPU 18 receives the detection voltage 101 and a supply voltage 102 from A/D 11a and 11b (S201). The CPU 18 adds these digital signals at a predetermined ratio (S202). The CPU 18 processes a difference between a result value of the addition and a value generated inside the CPU 18 corresponding to a control signal 103 to get a feedback signal 104 (S203). The CPU 18 outputs the feedback signal 104 to a D/A converter (D/A) 12 (S204).

3.2 Effect of Third Exemplary Embodiment

In the exemplary embodiment, the same effect as the embodiment shown in FIG. 10 including precisely controlled feedback loop and correction by the temperature sensor 14. In the third exemplary embodiment, the CPU 18 digitally adds the detection voltage 101 to the supply voltage 102 instead of the OP-AMP 8 which is an analog circuit. Therefore, in the third exemplary embodiment, there is no effect caused by fluctuations of resistance or characteristics of the OP-AMP due to change of an ambient temperature. Therefore, a highly precise processing result is obtained and stable output power control can be performed.

In the first to the third exemplary embodiments of the present invention, it is described that an example of the power amplifier circuit which includes two amplifiers of the pre-amplifier 20 having the ATT 1 in an input part thereof and the power amplifier 4 in the post stage (final stage), and controls the ATT 1 using the feedback signal. On the other hand, it is obvious that the amplifier 2 is utilized as a pre-amplifier and an output thereof is controlled by a gain thereof. The present invention includes amplifier circuits of any alternative configurations. In the above-mentioned exemplary embodiments, an example in which the detector 5 is connected by the directional coupler (D-CPL) 3 just in front of the power amplifier 4 of the final stage is shown. Additionally, the detector can be connected using various branch circuits instead of the D-CPL 3. The present invention includes these any configurations.

As an exemplary embodiment, for example, a specific example in which the supply voltage Vd 73 outputted from the power supply (PS) 6 to the power amplifier 4 is added to the detection output of the DET 5 is shown in the FIG. 1. It is obvious theoretically that control of the ATT 1 arranged in the input side of the amplifier 2 can be performed based on the detection output and a difference between an adding value of the supply voltage and the reference voltage. For example, even if an analog adder subtracts supply voltage Vd at a predetermined ratio from the reference voltage Vr 75 of the OP-AMP 8, the similar effect is obtained. It is also obvious that the exemplary embodiments described above include any change in configurations.

4. Fourth Exemplary Embodiment

4.1 Configuration of Fourth Exemplary Embodiment

Figure 12:
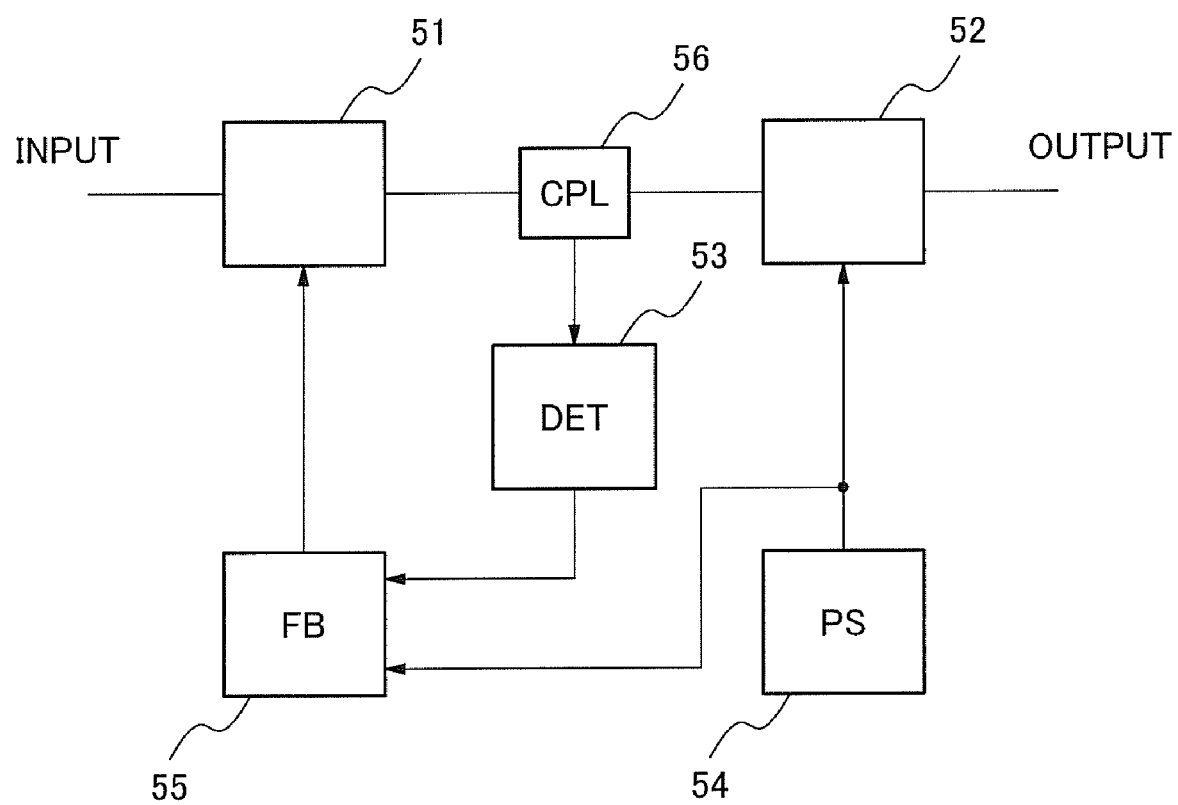
FIG. 12 is a diagram showing a configuration of a power amplifier circuit built with the elements indispensable to the present invention.

FIG. 12 is a configuration of a power amplifier circuit built with the elements indispensable to the present invention. In the block diagram of FIG. 12, the power amplifier circuit of the present invention includes a pre-amplifier 51, a power amplifier 52, a detector (DET) 53, a power supply (PS) 54, a feedback circuit (FB) 55 and a coupler (CPL) 56.

The CPL 56 branches an output of the pre-amplifier 51 and inputs the output to the DET 53. The DET 53 detects a signal inputted from the CPL 56 and inputs the signal to the FB 55. The PS 54 supplies an electric power to the power amplifier 52. An output of the DET 53 and a branched supply voltage from the PS 54 are inputted to the FB 55. The FB 55 outputs a signal obtained by processing these inputs to the pre-amplifier 51 to control the pre-amplifier 51.

That is, the power amplifier circuit, having a configuration shown in FIG. 12 includes a pre-amplifier having a control circuit for performing a feedback control of an output and a power amplifier in a final stage, controls the pre-amplifier based on the detection voltage of an output of the pre-amplifier and the supply voltage of the power amplifier. Therefore, the power amplifier circuit described in FIG. 12 solves a problem that there are a lot of losses in the CPL 56 and a gain of the power amplifier changes based on a voltage supplied thereto to cause instability in the feedback loop.

The present invention can be widely used for whole radio communication equipment. In particular, the present invention is effective in a transmitter of a high electric power and equipment for a battery operation in which power efficiency is important, or effective in equipment to be miniaturized in order to reduce a heat radiation structure.

Figure 15:
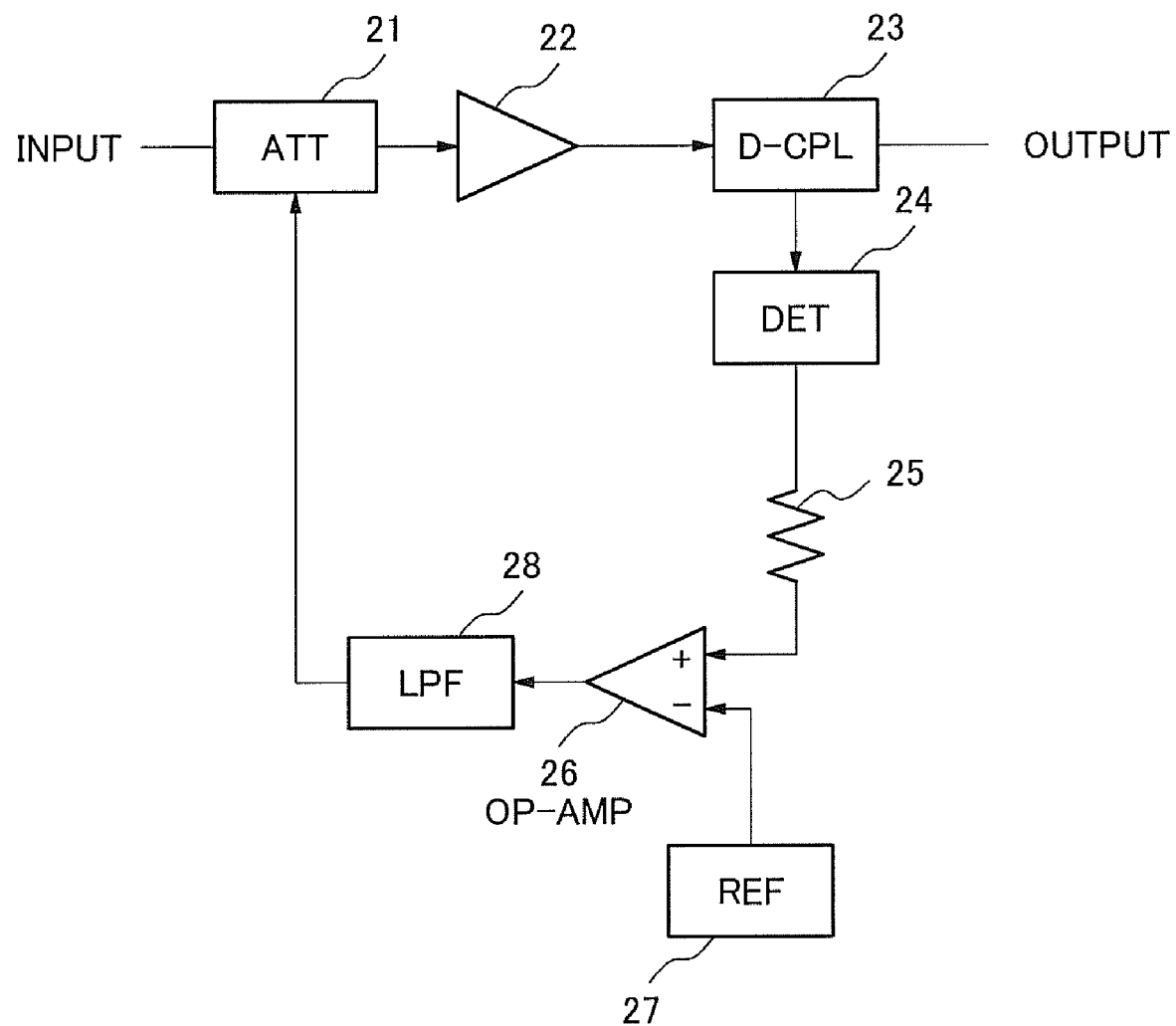
FIG. 15 is a diagram showing a power amplifier circuit of a related art of the present invention.
Figure 16:
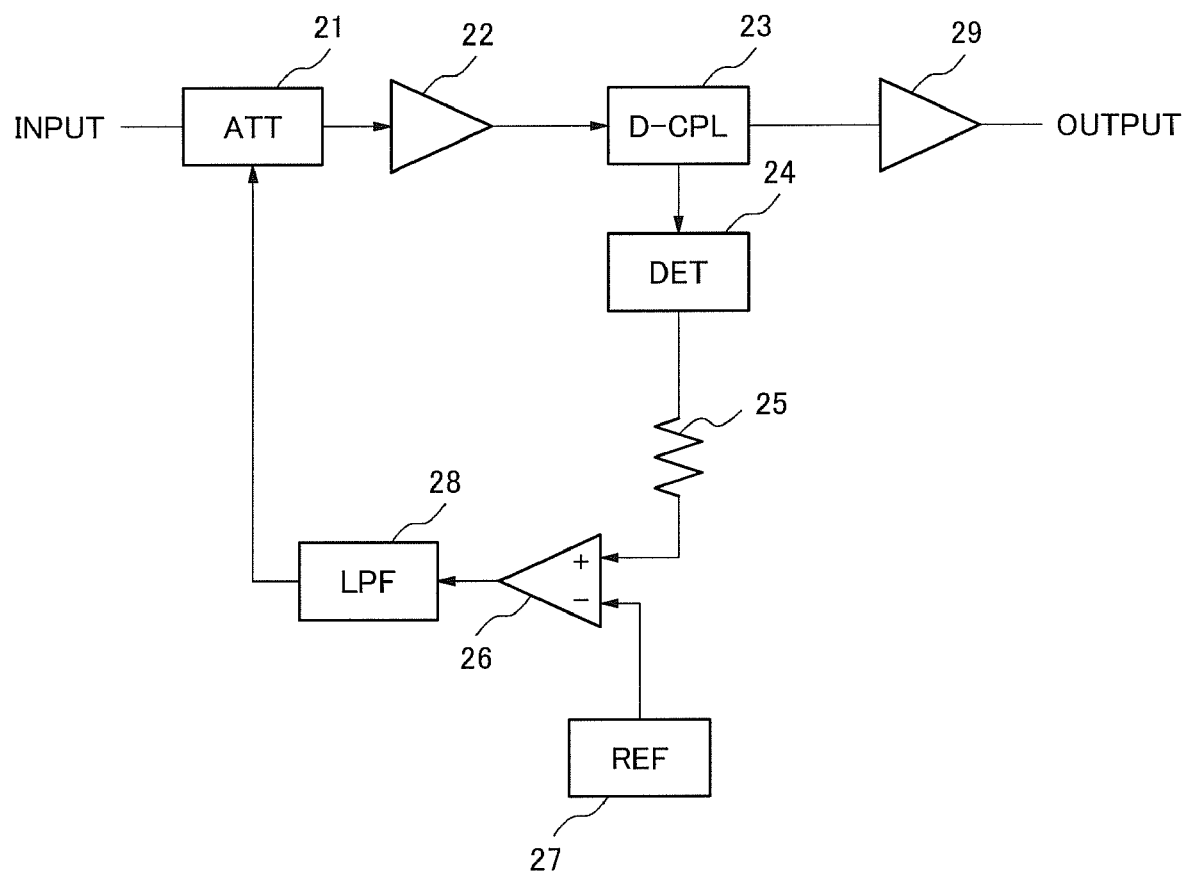
FIG. 16 is a diagram showing other power amplifier circuit of a related art of the present invention.
Figure 17:
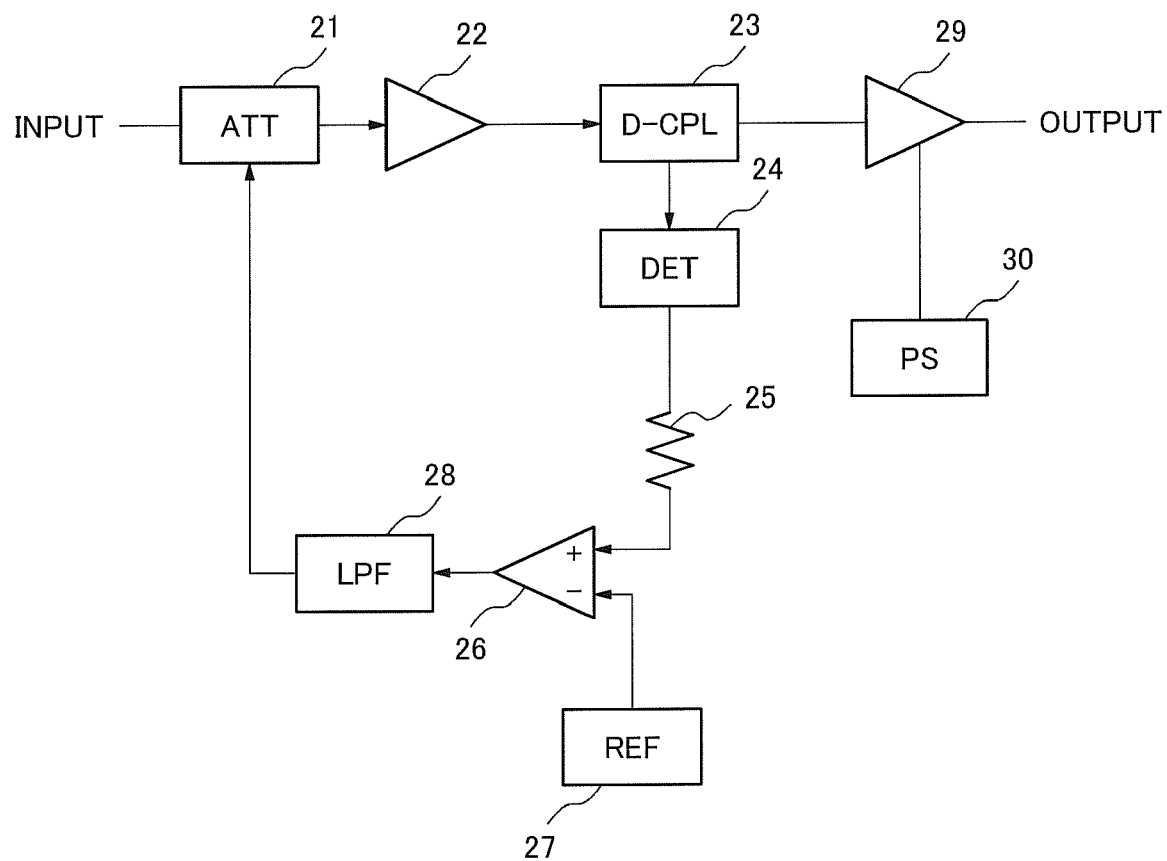
FIG. 17 is a diagram showing another power amplifier circuit of a related art of the present invention.

In the power amplifier circuit shown in a FIG. 15 of the related art described in the background art, in order to keep an output of a transmitter constant, an output of the power amplifier is detected, and an input level thereof is controlled according to the detected voltage. In other power amplifier circuit shown in a FIG. 16 of the related art described in the background art, in order to improve efficiency of the power amplifier, the amplifier is divided into the pre-amplifier and the power amplifier of the final stage to reduce an output loss. In other power amplifier circuit shown in a FIG. 17 of the related art described in the background art, a voltage supplied to power amplifier is controlled.

In a power amplifier circuit which controls a voltage supplied to a power amplifier, it is desirable that a gain of the power amplifier does not change. However, actually, the gain of the power amplifier changes due to the supply voltage. Therefore, the power amplifier circuit shown in FIG. 15, since a desired correct power value is not obtained, cannot normally control an electric power of the power amplifier. The power amplifier circuit shown in FIG. 15 cannot keep an output power constant in a wide range.

In particular, in power amplifier circuit shown in FIG. 15, when a transmitting power is controlled systematically in Automatic Transmission Power Control (ATPC), a control loop becomes divergent in a case that transmission power control is performed based on a reception level of an opposite station, for example.

Thus, because a gain of the power amplifier changes when the power amplifier circuit of the related art described in the background art changes the supply voltage of the power amplifier, an output as a transmitter fluctuates. In the power amplifier of the related art described in the background art, when a break point is formed in an automatic level control (ALC) loop, control becomes unstable.

The following are exemplary advantages according to the invention. In the present invention, the directional coupler and the detector are provided just in front of the power amplifier of the final stage. Thus, loss of the output of the amplifier can be reduced. Further, power efficiency of the whole amplifier can be improved. When the supply voltage of the power amplifier is changed, the output power thereof changes and the power amplifier can always be used in an efficient range. Moreover, in the present invention, the pre-amplifier is controlled based on the supply voltage of the power amplifier and the detection voltage. As a result, even if the gain of the power amplifier fluctuates due to the supply voltage, linearity of the power level with respect to the control signal of the power amplifier improves. It is possible to prevent a control loop from becoming unstable.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

What is claimed is:

1. A power amplifier circuit, comprising:
    a first variable-gain amplifier for amplifying an input signal at a first gain;
    a second variable-gain amplifier for amplifying an output signal of said first amplifier at a second gain; and
    a control circuit for controlling said first gain of said first variable-gain amplifier based on said output signal of said first variable-gain amplifier and said second gain.

2. The power amplifier circuit according to claim 1, wherein said control circuit controls said first gain of said first variable-gain amplifier based on a detection signal of said output signal of said first variable-gain amplifier and a gain control signal to said second variable-gain amplifier.

3. The power amplifier circuit according to claim 2, comprising:
    a directional coupler for branching said output of said first variable-gain amplifier into a first signal and second signal; and
    a detector for detecting said second signal and for outputting a detection signal,
    wherein said second variable-gain amplifier amplifies said first signal.

4. The power amplifier circuit according to claim 1, wherein said first variable-gain amplifier comprises an attenuator including a variable attenuation factor, and
    said first gain is controlled by said attenuation factor which is controlled by said control circuit.

5. The power amplifier circuit according to claim 3, wherein said control circuit comprises:
    an analog adder for adding said detection signal to said gain control signal; and
    a subtraction circuit for outputting amplitude of a difference between an output of said analog adder and a predetermined reference voltage,
    wherein said first gain is controlled based on an output of said subtraction circuit.

6. The power amplifier circuit according to claim 5, wherein said control circuit comprises:
a control unit;
an analog-to-digital (A/D) converter for A/D converting said output of said analog adder; and
a digital-to-analog (D/A) converter for converting a digital value from said control unit into an analog signal to output to said first amplifier,
wherein said control circuit outputs said digital value based on a result of analog-digital conversion of said output of said analog adder and said reference voltage.

7. The power amplifier circuit according to claim 3, wherein said control circuit comprising:
a control unit;
a first analog-to-digital (A/D) converter for A/D converting said detection voltage;
a second A/D converter for A/D converting gain control signal to said second amplifier; and
a digital-to-analog converter (D/A) for converting a digital value from said control unit into an analog signal to output to said first amplifier,
wherein said control circuit outputs said digital value based on an A/D conversion result of said first A/D converter and an A/D conversion result of said second A/D converter.

8. A control program of power amplifier circuit for causing a CPU of said control unit of claim 6, to realize a function of said power amplifier circuit.

9. A recording medium recording a control program of a power amplifier circuit, wherein said control program is said control program according to claim 8.

10. A control program of power amplifier circuit for causing a CPU of said control unit of claim 7, to realize a function of said power amplifier circuit.

11. A recording medium recording a control program of a power amplifier circuit, wherein said control program is said control program according to claim 10.

12. The power amplifier circuit of claim 1, where the control circuit is for controlling said first gain based on said output signal of said first variable-gain amplifier and said second gain and not based on an output signal of said second variable-gain amplifier.

13. A control method for a power amplifier circuit including a first variable-gain amplifier having a first gain and a second variable-gain amplifier having a second gain for amplifying an output signal of said first variable-gain amplifier, said method comprising:
detecting an amplitude of said output signal of said first variable-gain amplifier; and
controlling said first gain based on said amplitude of said output signal of said first variable-gain amplifier and said second gain.

14. The control method for the power amplifier circuit according to claim 13, wherein
said detecting includes detecting an amplitude of a detection signal of said output signal of said first variable-gain amplifier; and
said controlling includes controlling said first gain based on said amplitude and gain control signal to said second variable-gain amplifier.

15. The control method of the power amplifier circuit according to claim 14, wherein detecting said amplitude of said detection signal from a signal branched from an output of said first variable-gain amplifier.

16. The control method of the power amplifier circuit according to claim 13, wherein changing an attenuation factor of an attenuator; and controlling said first gain based on said attenuation factor.

17. The control method of the power amplification circuit according to claim 14, further comprising:
adding said amplitude of said detection signal to said gain control signal; and
outputting an amplitude of a difference between said addition result and a predetermined reference voltage,
wherein said first gain is controlled based on said amplitude.

18. The control method of the power amplifier circuit according to claim 17, comprising:
A/D converting said addition result;
calculating a digital value to control said gain of said first amplifier based on said A/D conversion result and said reference voltage; and
D/A converting said digital value.

19. The control method of the power amplifier circuit according to claim 14, comprising:
A/D converting said detection voltage;
A/D converting a signal to control said second gain;
outputting a digital value based on an A/D conversion result of said detection voltage and an A/D conversion result of said signal to control said second gain; and
D/A converting said digital value.

20. The control method of claim 13, wherein controlling said first gain is based on said amplitude of said output signal of said first variable-gain amplifier and said second gain and not on an output signal of said second variable-gain amplifier.

* * * * *